(12) United States Patent
Lee et al.

(10) Patent No.: US 7,141,854 B2
(45) Date of Patent: Nov. 28, 2006

(54) DOUBLE-GATED SILICON-ON-INSULATOR (SOI) TRANSISTORS WITH CORNER ROUNDING

(75) Inventors: Yong Meng Lee, Singapore (SG); Da Jin, Shang Hai (CN); David Vigar, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/174,857

(22) Filed: Jul. 5, 2005

(65) Prior Publication Data

US 2006/0014336 A1    Jan. 19, 2006

Related U.S. Application Data

(63) Continuation of application No. 10/662,674, filed on Sep. 15, 2003, now Pat. No. 6,927,104.

(51) Int. Cl.
*H01L 27/01* (2006.01)
*H01L 27/12* (2006.01)
*H01L 31/0392* (2006.01)
*H01L 23/62* (2006.01)

(52) U.S. Cl. .................... 257/347; 257/348; 257/357; 257/E29.275

(58) Field of Classification Search ................ 257/347, 257/348, 357, E29.275
See application file for complete search history.

(56) References Cited

U.S. PATENT DOCUMENTS

| 6,365,465 | B1 | 4/2002 | Chan et al. ................. 438/283 |
| 6,396,108 | B1 | 5/2002 | Krivokapic et al. ........ 257/365 |
| 6,413,802 | B1 | 7/2002 | Hu et al. .................... 438/151 |
| 6,451,656 | B1 | 9/2002 | Yu et al. ..................... 438/283 |

*Primary Examiner*—William M. Brewster
(74) *Attorney, Agent, or Firm*—Saile Ackerman LLC; Stephen B. Ackerman; Stephen G. Stanton

(57) ABSTRACT

A method of forming a double-gated transistor having a rounded active region to improve GOI and leakage current control comprises the following steps, inter alia. An SOI substrate is patterned and a rounded oxide layer is formed over the exposed side walls of a patterned upper SOI silicon layer. A dummy layer, having an opening defining a gate, is formed over the exposed patterned top oxide layer and the exposed portions of the upper SOI silicon layer. An undercut is formed into the undercut lower SOI oxide layer and the exposed gate area portion of the oxide layer is removed. The portion of the rounded oxide layer within the gate area is removed and a conformal oxide layer is formed over a part of the structure. A gate is formed within the second patterned dummy layer opening and the patterned dummy layer is removed to form the double gated transistor.

27 Claims, 6 Drawing Sheets

DOUBLE-GATED SILICON-ON-INSULATOR (SOI) TRANSISTORS WITH CORNER ROUNDING

This is a continuation application of parent application Ser. No. 10/662,674 filed Sep. 15, 2003 now U.S. Pat. No. 6,927,104.

FIELD OF THE INVENTION

The present invention relates generally to fabrication of semiconductor devices, and more specifically to methods of fabricating double-gated semiconductor-on-insulator-on-insulator (SOI) transistors.

BACKGROUND OF THE INVENTION

Double-gated transistors offer greater performance compared to conventional planar transistors. However, a problem has been how to fabricate such double-gated transistors. Current techniques being examined today include epitaxial growth to form the channel after gate oxidation and fin field effect transistors (FET). ("Fin" usually means a vertical silicon piece that is the gate, but there are many variations of fin-FETs.)

U.S. Pat. No. 6,451,656 B1 to Yu et al. describes a double-gated transistor on semiconductor-on-insulator (SOI).

U.S. Pat. No. 6,413,802 B1 to Hu et al. describes a double-gated FinFFET on semiconductor-on-insulator (SOI).

U.S. Pat. No. 6,365,465 B1 to Chan et al. also describes a process for a double-gated MOSFET on semiconductor-on-insulator (SOI).

U.S. Pat. No. 6,396,108 B1 to Krivokapic et al. describes a process for a double-gated MOSFET on semiconductor-on-insulator (SOI).

SUMMARY OF THE INVENTION

Accordingly, it is an object of the present invention to provide methods of forming double-gated silicon-on-insulator (SOI) transistors having improved gate oxide integrity (GOI) and leakage current control.

Other objects will appear hereinafter.

It has now been discovered that the above and other objects of the present invention may be accomplished in the following manner. Specifically, a substrate having an SOI structure formed thereover is provided. The SOI structure including a lower SOI oxide layer and an upper SOI silicon layer. A top oxide layer is formed over the SOI structure. A first top dummy layer is formed over the top oxide layer. The first top dummy layer, top oxide layer, and upper SOI silicon layer are patterned to form a patterned first top dummy layer/top oxide layer/upper SOI silicon layer stack having exposed side walls. The patterned upper SOI silicon layer including a source region and a drain region connected by a channel portion. A rounded oxide layer is formed over the exposed side walls of the patterned upper SOI silicon layer which also rounds the patterned upper SOI silicon layer. The patterned first top dummy layer is removed, exposing the patterned top oxide layer. A second patterned dummy layer is formed over the exposed patterned top oxide layer and the exposed portions of the upper SOI silicon layer. The second patterned dummy layer having an opening that defines a gate area exposing: a portion of the oxide layer within the gate area; portions of the upper surface of the lower SOI oxide layer within the gate area; and a portion of the rounded oxide layer within the gate area. The exposed gate area portions of the upper surface of the lower SOI oxide layer are etched into the lower SOI oxide layer to: form an undercut into the undercut lower SOI oxide layer exposing a bottom portion of the patterned upper SOI silicon layer within the gate area; remove the exposed gate area portion of the oxide layer exposing a top portion of the patterned upper SOI silicon layer within the gate area; and remove the portion of the rounded oxide layer within the gate area exposing a portion of the side walls of the patterned upper SOI silicon layer within the gate area. A conformal oxide layer is formed over: the exposed bottom portion of the patterned upper SOI silicon layer within the gate area; the exposed top portion of the patterned upper SOI silicon layer within the gate area; and the exposed portion of the side walls of the patterned upper SOI silicon layer within the gate area. A gate is formed within the second patterned dummy layer opening and includes an upper gate above the patterned upper SOI silicon layer within the gate area and a lower gate under the upper SOI silicon layer within the gate area. The second patterned dummy layer is removed to form the double-gated transistor.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

This invention provides an alternative way to fabricate double-gated transistors 80 using a silicon-on-insulator (SOI) substrate as the starting material. Since the technique of the present invention uses the top and bottom sides of the SOI to form the gate, surface mobility is not degraded as in the case of fin FETs. The SOI transistors formed in accordance with the present invention have improved gate oxide integrity (GOI) and leakage current control due to the corner rounding effect on the edge of the active region, the 'fin'.

Figure 1:
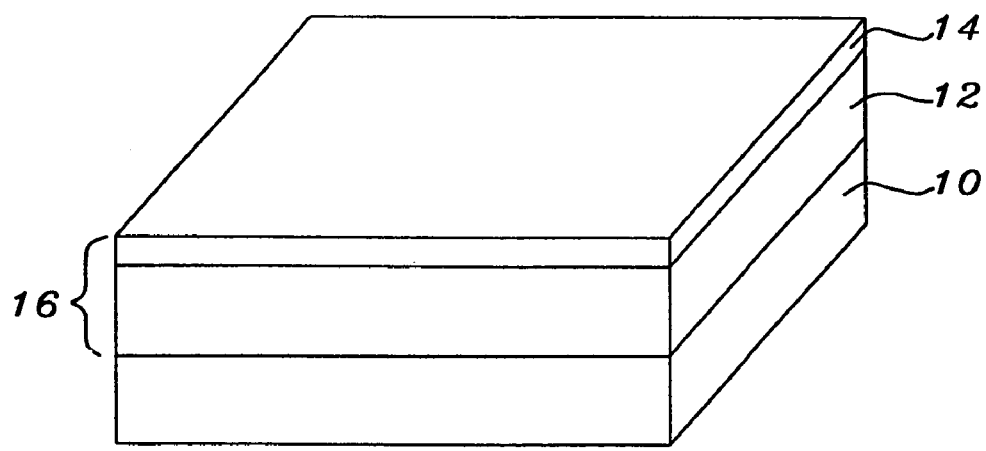
FIGS. 1 to 10 schematically illustrate a preferred embodiment of the present invention.

Initial Structure—FIG. 1

FIG. 1 schematically illustrates a structure 10 having a fully depleted silicon-on-insulator structure (SOI) 16 formed thereover.

Structure 10 is preferably a semiconductor substrate comprised of silicon or germanium and is more preferably a silicon semiconductor substrate.

SOI 16 includes: a lower SOI silicon oxide ($SiO_2$) layer 12 having a thickness of preferably from about 1000 to 5000 Å and more preferably from about 2000 to 4000 Å; and an overlying SOI silicon (Si) layer 14 having a thickness of preferably from about 300 to 2000 Å and more preferably from about 500 to 1500 Å.

Figure 2:
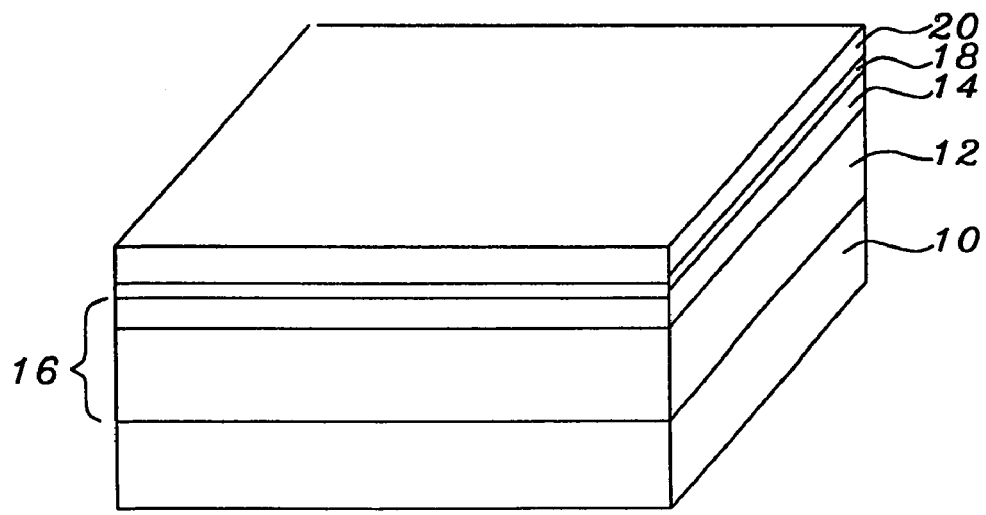

Formation of Top Oxide Layer 18 and First Top Dummy Layer 20—FIG. 2

As shown in FIG. 2, a top oxide (silicon oxide —$SiO_2$) layer 18 is formed over SOI 16 to a thickness of preferably from about 90 to 110 Å, more preferably from about 95 to 105 Å and most preferably about 100 Å.

Then, a first top dummy layer 20 is formed over top oxide layer 18 to a thickness of preferably from about 450 to 1050 Å and more preferably from about 500 to 1000 Å. The first top dummy layer 20 is preferably comprised of nitride, silicon nitride ($Si_3N_4$) or silicon oxynitride (SiON) and is more preferably comprised of nitride as will be used hereafter for illustrative purposes.

The first top dummy layer has a thickness of preferably from about 450 to 1050 Å and more preferably from about 500 to 1000 Å.

Patterning of First Top Dummy Nitride Layer 20/Top Oxide Layer 18/Overlying SOI Si Layer 14—FIG. 2

Figure 3:
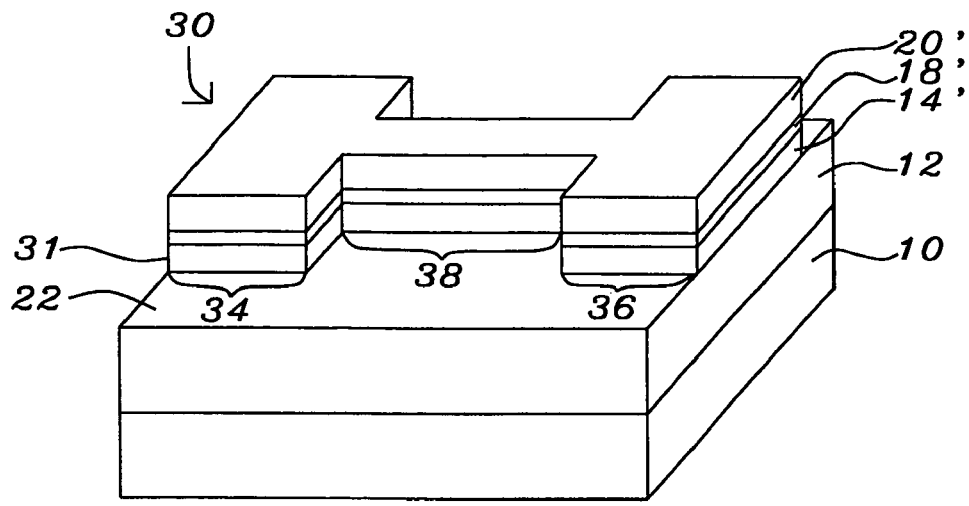

As shown in FIG. 3, the first top dummy nitride layer 20, top oxide layer 18 and overlying SOI silicon layer 14 of the SOI 16 are patterned down to the lower SOI oxide layer 12 to define: a patterned first top dummy nitride layer 20'/top oxide layer 18'/overlying SOI silicon layer 14' stack 30 with exposed side walls 31; the active region as shown and exposed portions 22 of lower SOI silicon oxide layer 12. The top nitride layer 10, top oxide layer 18 and overlying SOI silicon layer 14 may be patterned, for example, using an overlying patterned mask layer (not shown) preferably comprised of photoresist.

Patterned stack 30 may be roughly in the shape of a dumbbell with the opposing ends of the patterned overlying SOI silicon layer 14' being a opposing source region 34 and drain region 36 connected by a channel region 38.

Figure 4:
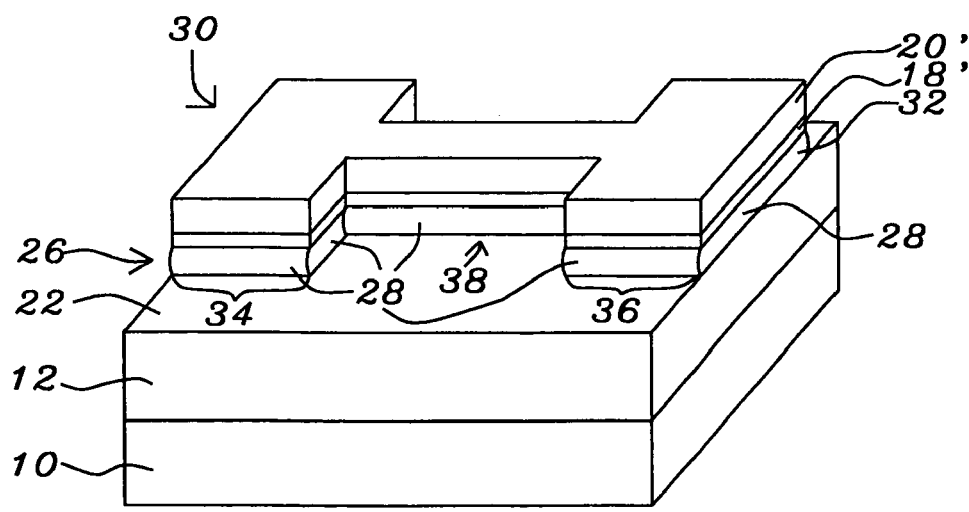

Formation of Rounded Oxide Layer 28—FIG. 4

As shown in FIG. 4, a rounded oxide layer 28 is formed over the exposed side walls 31 of the patterned overlying SOI silicon layer 14 to help protect the patterned overlying SOI silicon layer 14 from subsequent processing and completes formation of an oxide encased patterned overlying SOI silicon layer 32 comprising: the patterned overlying SOI silicon layer 14', the rounded oxide layer 28 and the patterned top oxide layer 18'. As shown in FIG. 4, rounded oxide layer 28 has rounded corners 26. Rounded oxide layer 28 has a thickness of preferably from about 80 to 550 Å and more preferably from about 100 to 500 Å.

Rounded oxide layer 28 is preferably formed by an oxidation growth process at a temperature of preferably from about 800 to 1200° C. and more preferably from about 900 to 1100° C. for from about 10 to 120 minutes and more preferably from about 20 to 100 minutes.

Figure 5:
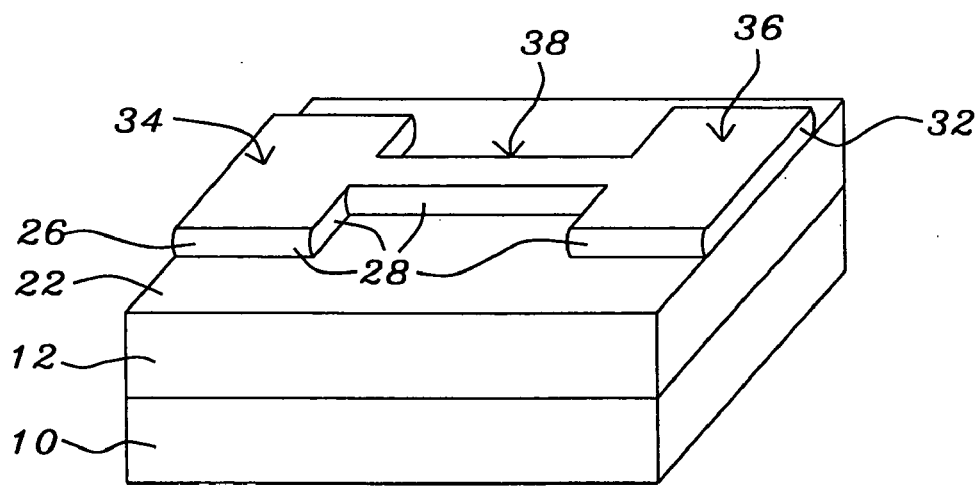

Removal of Patterned First Top Dummy Nitride Layer 20'—FIG. 5

As shown in FIG. 5, the patterned first top dummy nitride layer 20' is removed from the patterned stack 30 to expose the oxide encased patterned overlying SOI silicon layer 32. The patterned first top dummy nitride layer 20' is preferably removed employing a hot phosphoric acid etch selective to oxide/silicon oxide.

Figure 6:
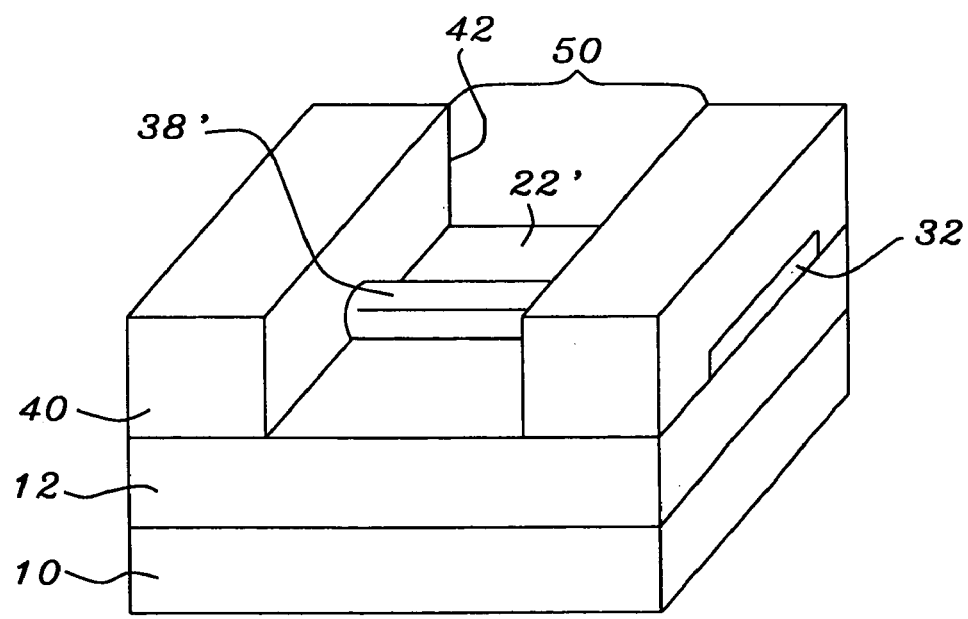

Formation of Second Patterned Dummy Layer 40—FIG. 6

As shown in FIG. 6, a second patterned dummy layer 40 is formed over the structure of FIG. 5. Second patterned dummy layer 40 may be patterned, for example, by using an overlying patterned gate reverse mask (not shown) and employing an anisotropic etch to form opening 42 opening up the gate area 50. Second patterned dummy layer 40 includes opening 42 that exposes: a gate portion 38' of the channel region 38 of the oxide encased patterned overlying SOI silicon layer 32 within gate area 50; and gate portions 22' of lower SOI silicon oxide layer 12 within gate area 50.

It is noted that the gate portion 38' of the oxide encased patterned overlying SOI silicon layer 32 has an overall rounded characteristic due to the formation of rounded oxide layer 28.

Second patterned dummy layer 40 is preferably comprised of nitride, silicon nitride ($Si_3N_4$) or silicon oxynitride (SiON) and is more preferably comprised of nitride as will be used hereafter for illustrative purposes.

Second patterned dummy layer 40 has a thickness of preferably from about 1000 to 3000 Å and more preferably from about 1500 to 2500 Å.

Figure 7:
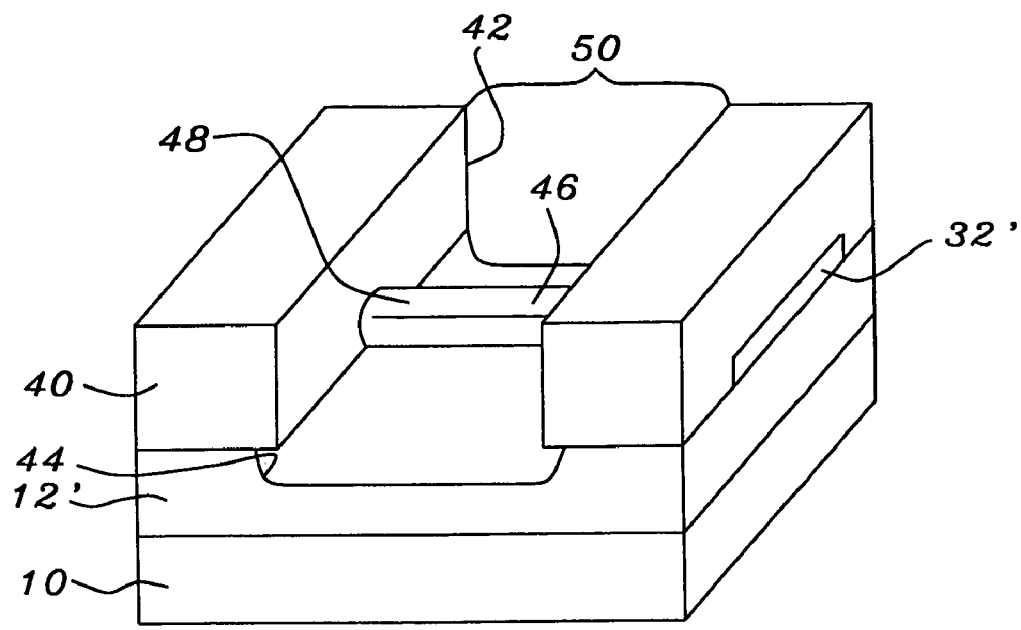

Etching of SOI Oxide Layer 12—FIG. 7

As shown in FIG. 7, an etch, preferably a dilute HF etch, is used to: (1) remove the portion of the patterned top oxide layer 18' overlying the patterned overlying SOI silicon layer 32' within gate area 50; (2) remove the portion of the rounded oxide layer 28 overlying the side walls 31 of the patterned overlying SOI silicon layer 32' within gate area 50; and (3) etch the SOI oxide layer 12 exposed within opening 42 to form an undercut 44 within etched SOI oxide layer 12' extending below the now denuded patterned overlying SOI silicon layer 32' within gate area 50.

The SOI oxide layer 12 is preferably etched using a dilute HF etch or a buffered oxide etch (BOE) and more preferably using a dilute HF etch.

Undercut 44 of the etched SOI oxide layer 12' is preferably from about 500 to 3000 Å and more preferably from about 1000 to 2000 Å deep and preferably protrudes from about 500 to 3000 Å and more preferably from about 500 to 1000 Å under the leading edges of opening 42 of second patterned dummy nitride layer 40.

Formation of Conformal Gate Oxide Layer 32—FIG. 7

As further shown in FIG. 7, a conformal oxide layer 46 is formed, preferably by growth, around the denuded patterned overlying SOI silicon layer 32' within gate area 50 to form a conformal oxide rounded gate portion 48 of the patterned overlying SOI silicon layer 14'. Conformal oxide layer 46 is grown on the exposed top, bottom and sides of the gate portion of the patterned overlying SOI silicon layer 14' to a thickness of preferably from about 5 to 200 Å and more preferably from about 10 to 50 Å.

Figure 8:
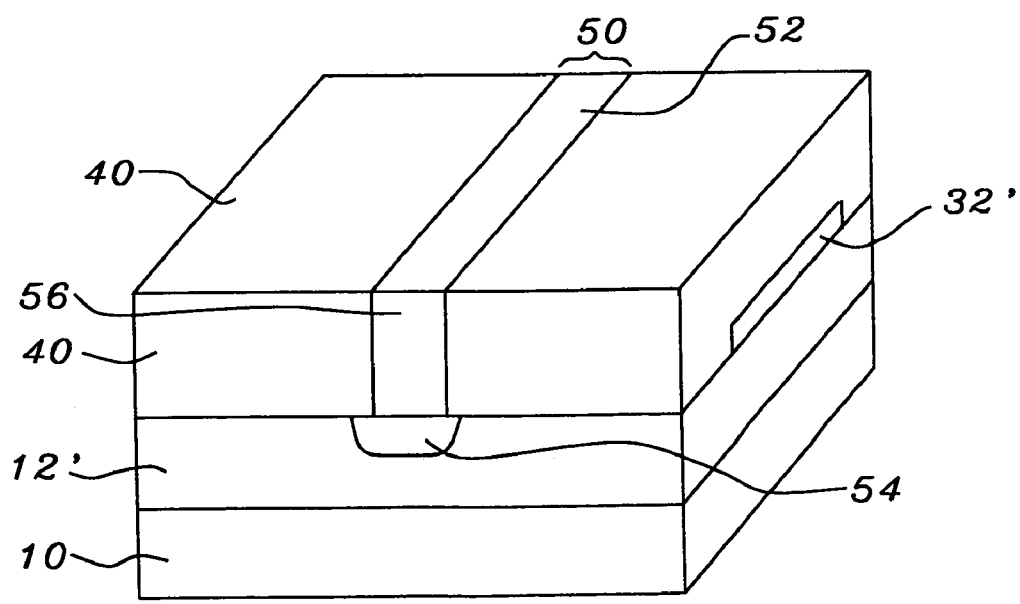

Formation of Gate 52—FIG. 8

As shown in FIG. 8, a gate layer is formed over the patterned dummy nitride layer 40, filling opening 42 and is planarized to remove the excess of the gate layer from over the top of patterned dummy nitride layer 40 to form a planarized gate 52 within opening 42. Gate 52 is preferably comprised of polysilicon (poly), tungsten (W), W—$Si_x$, silicon germanium (SiGe) or aluminum (Al) and is more preferably polysilicon (poly) as will be used hereafter for purposes of illustration.

Figure 11:
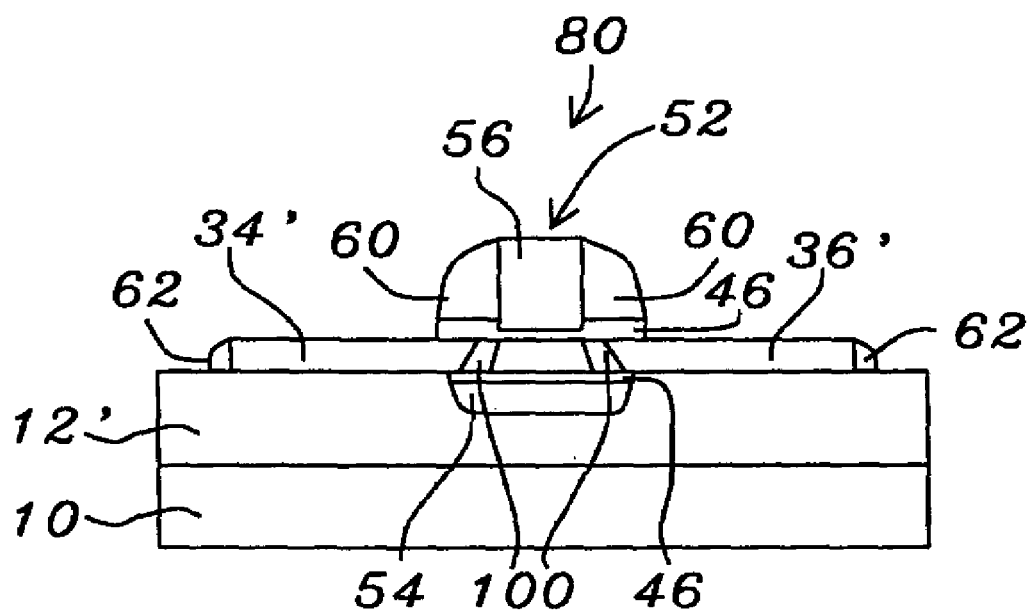
FIG. 11 is a cross-sectional view taken along line 11—11 of FIG. 10.
Figure 12:
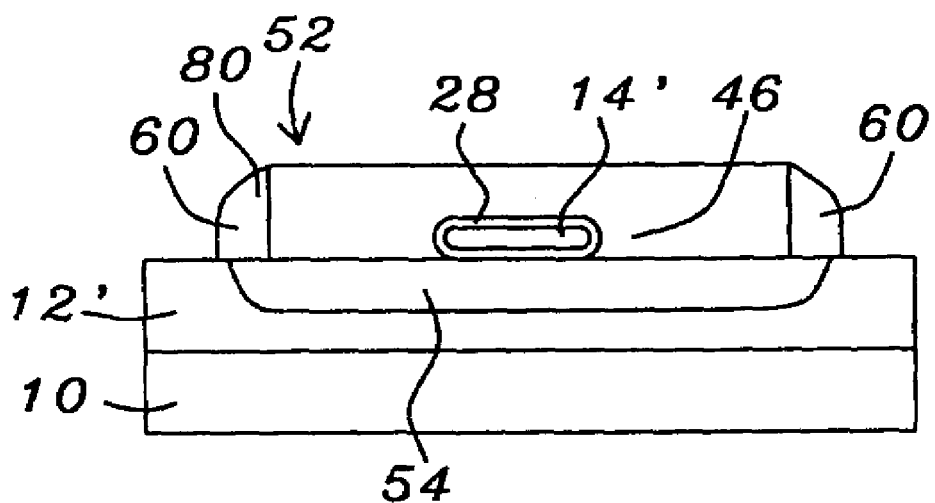
FIG. 12 is a cross-sectional view taken along line 12—12 of FIG. 10.

Poly gate 52 includes upper gate 56 and lower gate 54 separated by the conformal oxide rounded gate portion 48 of the patterned overlying SOI silicon layer 14' as more clearly shown in FIGS. 11 and 12.

Since polysilicon, for example, has good gap filling properties and the poly growth is conformal, poly gate 52 wraps completely around the conformal oxide layer 46 previously grown around the channel region 38 of patterned SOI silicon layer 14' within gate area 50.

The gate layer is preferably planarized by a chemical mechanical polishing (CMP) process to form the poly gate 52.

Figure 9:
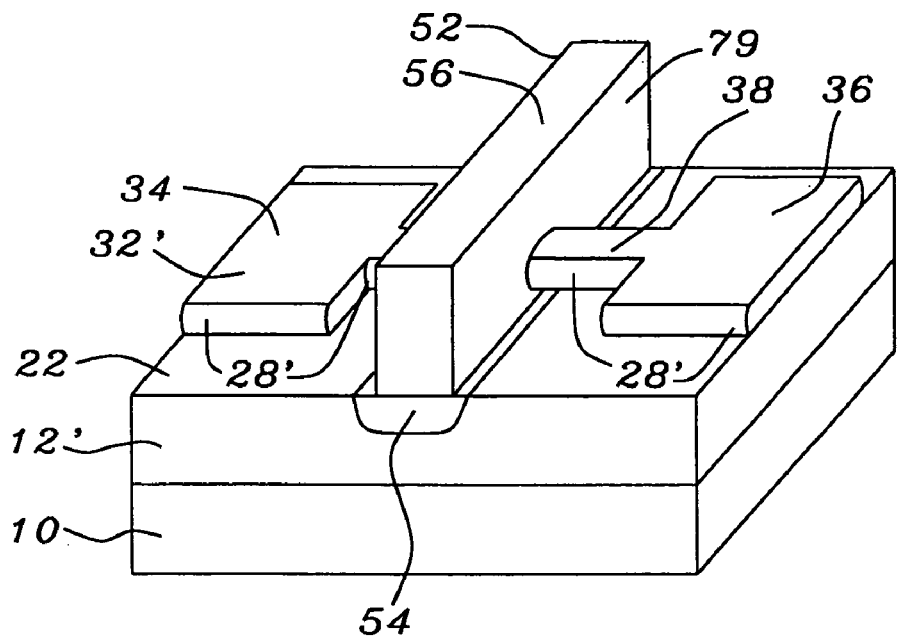

Removal of the Patterned Dummy Nitride Layer 40—FIG. 9

As shown in FIG. 9, the patterned dummy nitride layer 40 is removed from the structure of FIG. 8 to expose: the side walls 79 of upper poly gate 56; and the rounded oxide layer 28' of oxide encased patterned overlying SOI silicon layer 32 outside gate area 50. The patterned dummy nitride layer 40 is preferably removed using hot phosphoric acid.

LDD Implantation, Formation of Spacers 60 and Source-Drain Implants—FIG. 9

Figure 10:
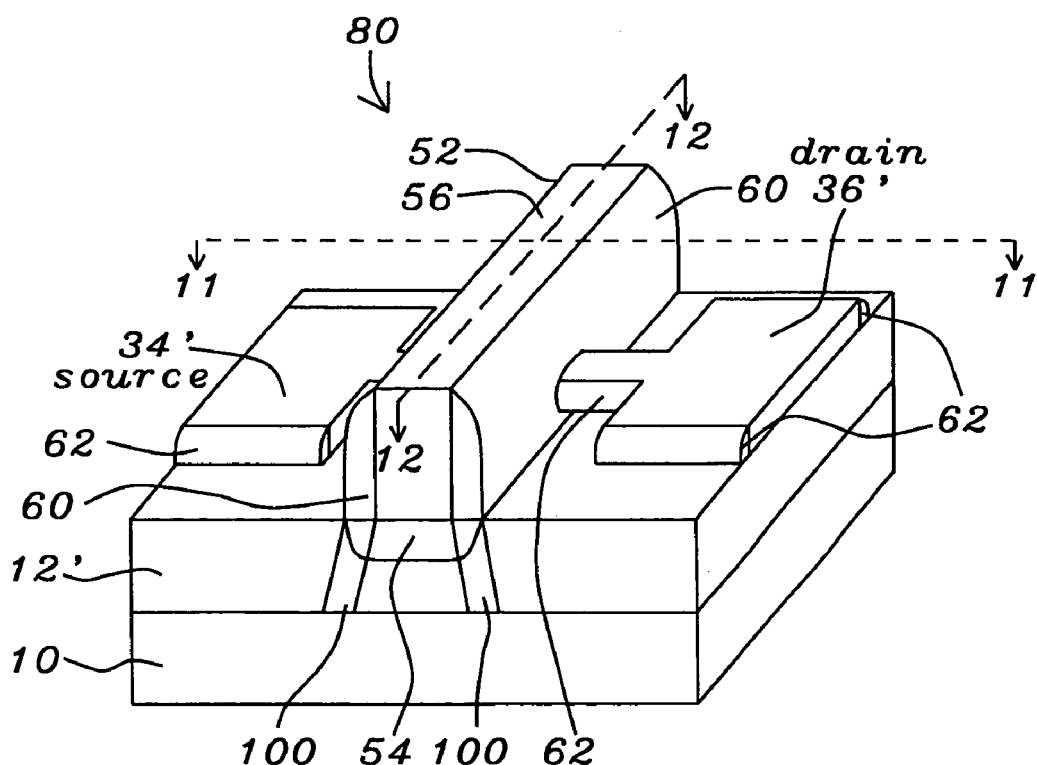

As shown in FIG. 10, conventional SDE or LDD implants 100 are performed and will exist under the spacers 60 (see below) and overlap the gate by a small portion. The silicon substrate is thin enough such that the SDE/LDD extend from top to bottom of the Si substrate.

Spacers 60 are then formed over the sidewalls 79 of upper poly gate 56, and spacers 62 are formed over the exposed rounded oxide layer 28' of oxide encased patterned overlying SOI silicon layer 32 outside gate area 50 as shown in FIG. 10. The rounded oxide layer 28 and the exposed portions of the patterned top oxide layer 18' overlying the patterned overlying patterned SOI silicon layer 14 are removed during the spacer etching in the formation of spacers 60, 62.

Source-drain (S/D) implants are then respectively formed into source region 34 and drain region 36, for example, to form source 34' and drain 36' to complete formation of double-gated transistor 80 with a conformal oxide rounded gate portion 48 of the patterned overlying SOI silicon layer 14'.

FIG. 11 is a cross-sectional representation of FIG. 10 along line 11—11 and illustrates upper gate 56 and lower gate 54 of poly gate 52 separated by the conformal oxide rounded gate portion 48 of the patterned overlying SOI silicon layer 14'. Sidewall spacers 60 extend over the side walls 42 of upper gate 56 of poly gate 52. Sidewall spacers 62 extend over the exposed rounded oxide layer 28' of oxide encased patterned overlying SOI silicon layer 32 outside gate area 50.

FIG. 12 is a cross-sectional representation of FIG. 10 along line 12—12, perpendicular to line 11—11, and illustrates upper gate 56 and lower gate 54 of poly gate 52 separated by the conformal oxide rounded gate portion 48 of the patterned overlying SOI silicon layer 14'. Sidewall spacers 60 extend over the side walls 79 of upper gate 56 of poly gate 52. As most clearly shown in FIG. 12, the formation of rounded oxide layer 28 (see FIG. 4) causes additional portions of the patterned SOI silicon layer 14' to be oxidized: (1) proximate top oxide layer 18; and (2) proximate SOI silicon oxide layer 12 to form a rounded patterned SOI silicon layer 14'.

Optionally, a standard salicidation process may then be used (TiSi, CoSi, etc., e.g.).

ADVANTAGES OF THE INVENTION

The advantages of one or more embodiments of the present invention include the rounded active region improves gate oxide integrity (GOI) and leakage current control.

Some Notable Qualities of this Invention Include:

1) making use of the top and bottom surfaces of the SOI for gate oxide channel formation—due to the fact that both surfaces have low surface roughness, the mobility is improved;

2) gate oxide is formed all around the channel which is more like a circular FET rather than a planar FET; and 3) W or WN may be used to form a metal gate instead of using polysilicon.

While particular embodiments of the present invention have been illustrated and described, it is not intended to limit the invention, except as defined by the following claims.

The invention claimed is:

1. A double-gated transistor structure, comprising:
   a) a substrate having an SOI structure formed thereover; the SOI structure including a lower SOI oxide layer and an upper patterned, rounded SOI silicon layer; the upper patterned, rounded SOI silicon layer including side walls, a source region portion and a drain region portion connected by a channel portion;
   b) a gate area within the lower SOI oxide layer and the upper patterned, rounded SOI silicon layer;
   c) a top patterned oxide layer over the upper patterned, rounded SOI silicon layer; the top patterned oxide layer not being over a top portion of the upper patterned, rounded SOI silicon layer within the gate area;
   d) a rounded oxide layer over a portion of the side walls of the patterned upper SOI silicon layer;
   e) an undercut in the lower SOI oxide layer defining a bottom portion of the patterned, rounded upper SOI silicon layer within the gate area;
   f) a conformal oxide layer over:
      i) the bottom portion of the patterned, rounded upper SOI silicon layer within the gate area;
      ii) the top portion of the patterned, rounded upper SOI silicon layer within the gate area; and
      iii) the portion of the side walls of the patterned, rounded upper SOI silicon layer within the gate area not covered by the rounded oxide layer;
   and
   g) a gate within the gate area; the gate including an upper gate portion above the patterned, rounded upper SOI silicon layer, and a lower gate portion under the patterned, rounded upper SOI silicon layer.

2. The structure of claim 1, wherein the substrate is a semiconductor substrate.

3. The structure of claim 1, wherein the substrate is comprised of silicon or germanium.

4. The structure of claim 1, wherein the lower SOI oxide layer has a thickness of from about 1000 to 5000 Å; the upper SOI silicon layer has a thickness of from about 300 to 2000 Å; the top patterned oxide layer has a thickness of from about 90 to 110 Å; the rounded oxide layer has a thickness of from about 80 to 550 Å; and the conformal oxide layer has a thickness of from about 5 to 200 Å.

5. The structure of claim 1, wherein the lower SOI oxide Layer has a thickness of from about 2000 to 4000 Å; the upper SOI silicon layer has a thickness of from about 500 to 1500 Å; the top patterned oxide layer has a thickness of from about 95 to 105 Å; the rounded oxide layer has a thickness of from about 100 to 500 Å; and the conformal oxide layer has a thickness of from about 10 to 50 Å.

6. The structure of claim 1, wherein the undercut is from about 500 to 3000 Å deep.

7. The structure of claim 1, wherein the undercut is from about 1000 to 2000 Å deep.

8. The structure of claim 1, wherein the gate is comprised of polysilicon, tungsten, W—$Si_x$, SiGe or aluminum.

9. The structure of claim 1, wherein the gate is comprised of polysilicon.

10. The structure of claim 1, further comprising a source implant within the source region portion of the upper patterned, rounded SOI silicon layer and a drain implant within the drain region portion of the upper patterned, rounded SOI silicon layer.

11. The structure of claim 1, further comprising LDD implants within the lower SOI oxide layer proximate the gate area.

12. The structure of claim 1, further comprising SDE implants within the lower SOI oxide layer proximate the gate area.

13. The structure of claim 1, wherein the upper gate portion has exposed side walls and further comprising spacers over the upper gate exposed side walls.

14. The structure of claim 1, wherein the source region portion, the drain region portion and the connecting channel portion form a dumbbell-shaped structure.

15. A double-gated transistor structure, comprising:
  a) a substrate having an SOI structure formed thereover; the SOI structure including a lower SOI oxide layer and an upper patterned, rounded SOI silicon layer; the upper patterned, rounded SOI silicon layer including side walls, a source region portion and a drain region portion connected by a channel portion; the source region portion, the drain region portion and the connecting channel portion forming a dumbbell-shaped structure
  b) a gate area within the lower SOI oxide layer and the upper patterned, rounded SOI silicon layer;
  c) a top patterned oxide layer over the upper patterned, rounded SOI silicon layer; the top patterned oxide layer not being over a top portion of the upper patterned, rounded SOI silicon layer within the gate area;
  d) a rounded oxide layer over a portion of the side walls of the patterned upper SOI silicon layer;
  e) an undercut in the lower SOI oxide layer defining a bottom portion of the patterned, rounded upper SOI silicon layer within the gate area;
  f) a conformal oxide layer over:
    i) the bottom portion of the patterned, rounded upper SOI silicon layer within the gate area;
    ii) the top portion of the patterned, rounded upper SOI silicon layer within the gate area; and
    iii) the portion of the side walls of the patterned, rounded upper SOI silicon layer within the gate area not covered by the rounded oxide layer; and
  g) a gate within the gate area; the gate including an upper gate portion above the patterned, rounded upper SOI silicon layer, and a lower gate portion under the patterned, rounded upper SOI silicon layer.

16. The structure of claim 15, wherein the substrate is a semiconductor substrate.

17. The structure of claim 15, wherein the substrate is comprised of silicon or germanium.

18. The structure of claim 15, wherein the lower SOI oxide layer has a thickness of from about 1000 to 5000 Å; the upper SOI silicon layer has a thickness of from about 300 to 2000 Å; the top patterned oxide layer has a thickness of from about 90 to 110 Å; the rounded oxide layer has a thickness of from about 80 to 550 Å; and the conformal oxide layer has a thickness of from about 5 to 200 Å.

19. The structure of claim 15, wherein the lower SOI oxide layer has a thickness of from about 2000 to 4000 Å; the upper SOI silicon layer has a thickness of from about 500 to 1500 Å; the top patterned oxide layer has a thickness of from about 95 to 105 Å; the rounded oxide layer has a thickness of from about 100 to 500 Å; and the conformal oxide layer has a thickness of from about 10 to 50 Å.

20. The structure of claim 15, wherein the undercut is from about 500 to 3000 Å deep.

21. The structure of claim 15, wherein the undercut is from about 1000 to 2000 Å deep.

22. The structure of claim 15, wherein the gate is comprised of polysilicon, tungsten, W—$Si_x$, SiGe or aluminum.

23. The structure of claim 15, wherein the gate is comprised of polysilicon.

24. The structure of claim 15, further comprising a source implant within the source region portion of the upper patterned, rounded SOI silicon layer and a drain implant within the drain region portion of the upper patterned, rounded SOI silicon layer.

25. The structure of claim 15, further comprising LDD implants within the lower SOI oxide layer proximate the gate area.

26. The structure of claim 15, further comprising SDE implants within the lower SOI oxide layer proximate the gate area.

27. The structure of claim 15, wherein the upper gate portion has exposed side walls and further comprising spacers over the upper gate exposed side walls.

* * * * *